US007836421B2

(12) United States Patent
Wang et al.

(10) Patent No.: US 7,836,421 B2
(45) Date of Patent: Nov. 16, 2010

(54) SEMICONDUCTOR LAYOUT DESIGN APPARATUS AND METHOD FOR EVALUATING A FLOORPLAN USING DISTANCES BETWEEN STANDARD CELLS AND MACROCELLS

(75) Inventors: Shen Wang, Yokohama (JP); Tetsuaki Utsumi, Kawasaki (JP); Mizue Sekine, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 446 days.

(21) Appl. No.: 11/941,748

(22) Filed: Nov. 16, 2007

(65) Prior Publication Data

US 2008/0120582 A1    May 22, 2008

(30) Foreign Application Priority Data

Nov. 17, 2006    (JP) .............................. 2006-311985

(51) Int. Cl.
    *G06F 17/50* (2006.01)
(52) U.S. Cl. ....................................................... 716/10
(58) Field of Classification Search ................ 716/2, 716/4–10
    See application file for complete search history.

(56) References Cited

U.S. PATENT DOCUMENTS

| 5,309,371 | A  | * | 5/1994 | Shikata et al. ................ 716/10 |
| 5,544,067 | A  | * | 8/1996 | Rostoker et al. .............. 703/14 |
| 5,793,644 | A  | * | 8/1998 | Koford et al. .................. 716/2 |
| 6,282,694 | B1 |   | 8/2001 | Cheng et al. |
| 6,792,583 | B1 |   | 9/2004 | Takahashi et al. |
| 7,062,743 | B2 |   | 6/2006 | Kahng et al. |
| 7,076,756 | B2 | * | 7/2006 | Ichimiya ...................... 716/10 |
| 2004/0133868 | A1 | * | 7/2004 | Ichimiya ...................... 716/10 |
| 2005/0155007 | A1 |   | 7/2005 | Kurokawa et al. |
| 2006/0218515 | A1 |   | 9/2006 | Byrn et al. |
| 2008/0134120 | A1 | * | 6/2008 | Wang et al. .................... 716/10 |

FOREIGN PATENT DOCUMENTS

| JP | 06-244280 | 9/1994 |
| JP | 2006-190062 | 7/2006 |

* cited by examiner

*Primary Examiner*—Stacy A Whitmore
(74) *Attorney, Agent, or Firm*—Turocy & Watson, LLP

(57) ABSTRACT

A semiconductor layout design apparatus has an inter-block connection information extracting part, a cell initial placement part and an evaluation value. The inter-block connection information extracting part configured to extract the number of wiring connections between a plurality of blocks including standard cells and macrocells based on a net list, library information, floor plan information and technology information. The cell initial placement part configured to initially place the standard cells and the macrocells in an placement region to generate an initial floor plan. The evaluation value calculating part configured to calculate an evaluation value of the floor plan based on distances between a plurality of blocks including the standard cells and the macrocells initially placed by the cell initial placement part and the extracted number of the wiring connections between a plurality of blocks.

20 Claims, 5 Drawing Sheets

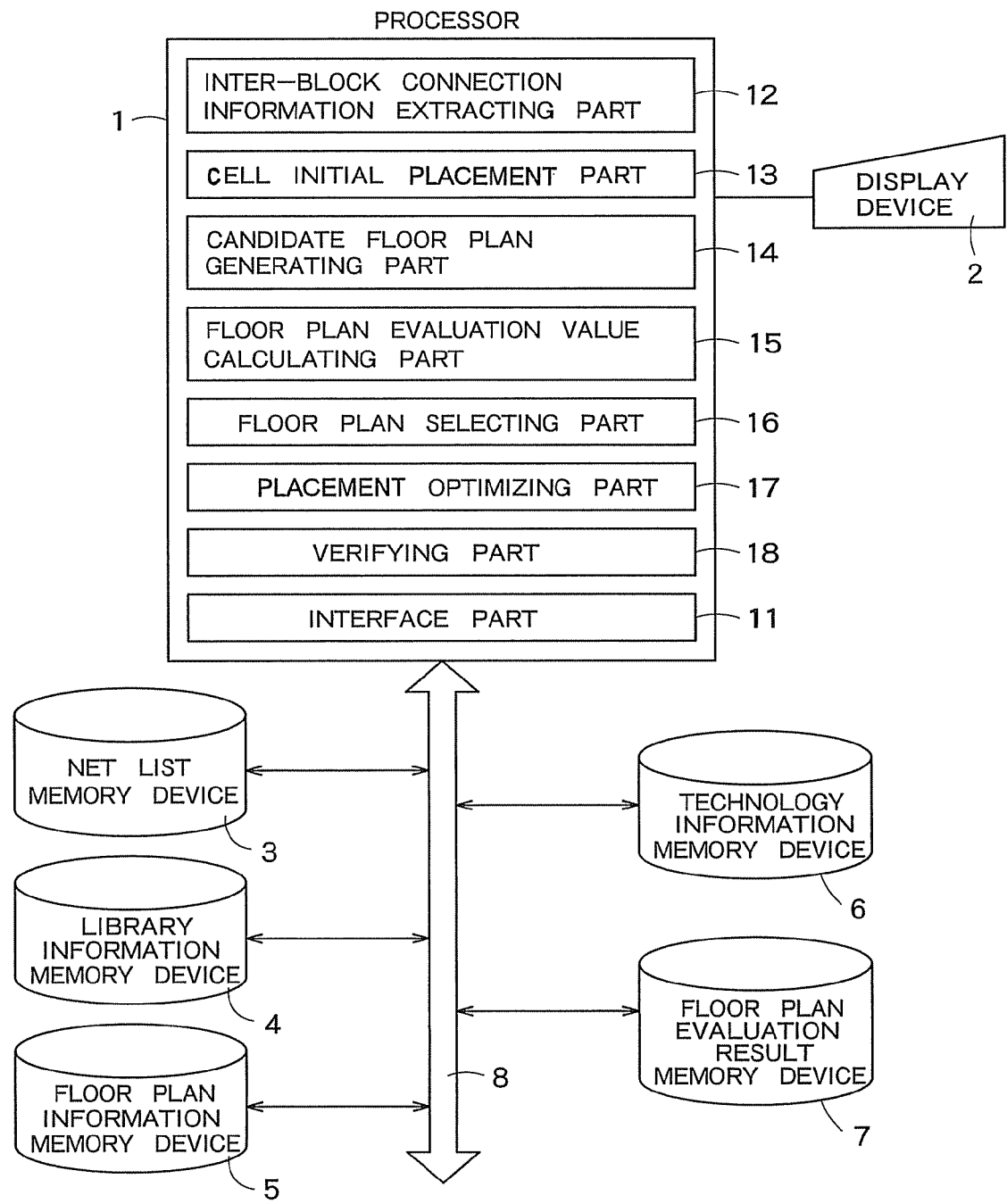
F I G. 1

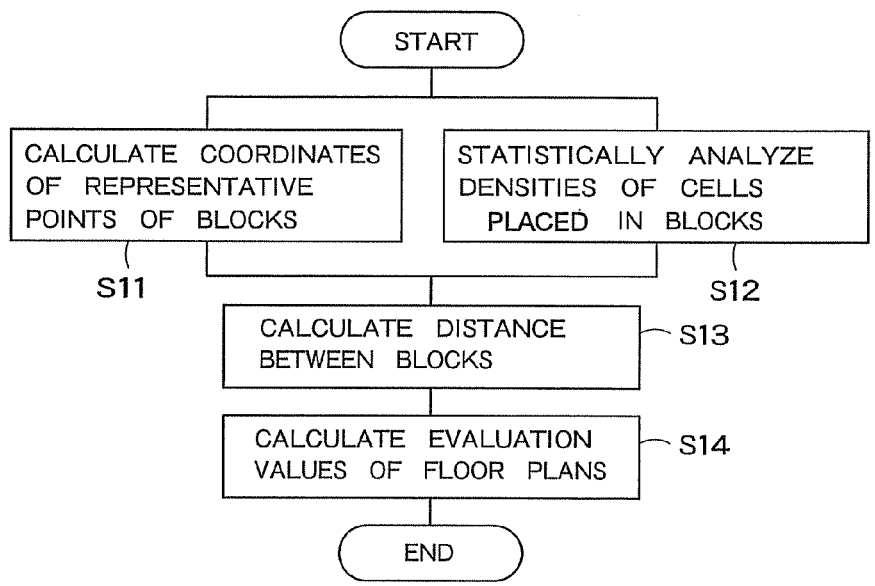
F I G. 4
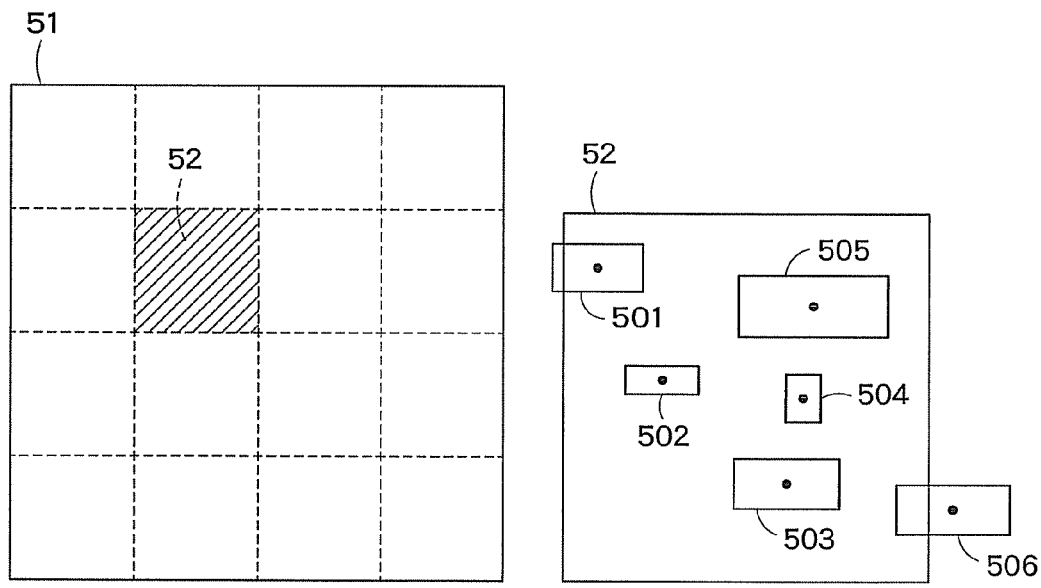
F I G. 5A    F I G. 5B

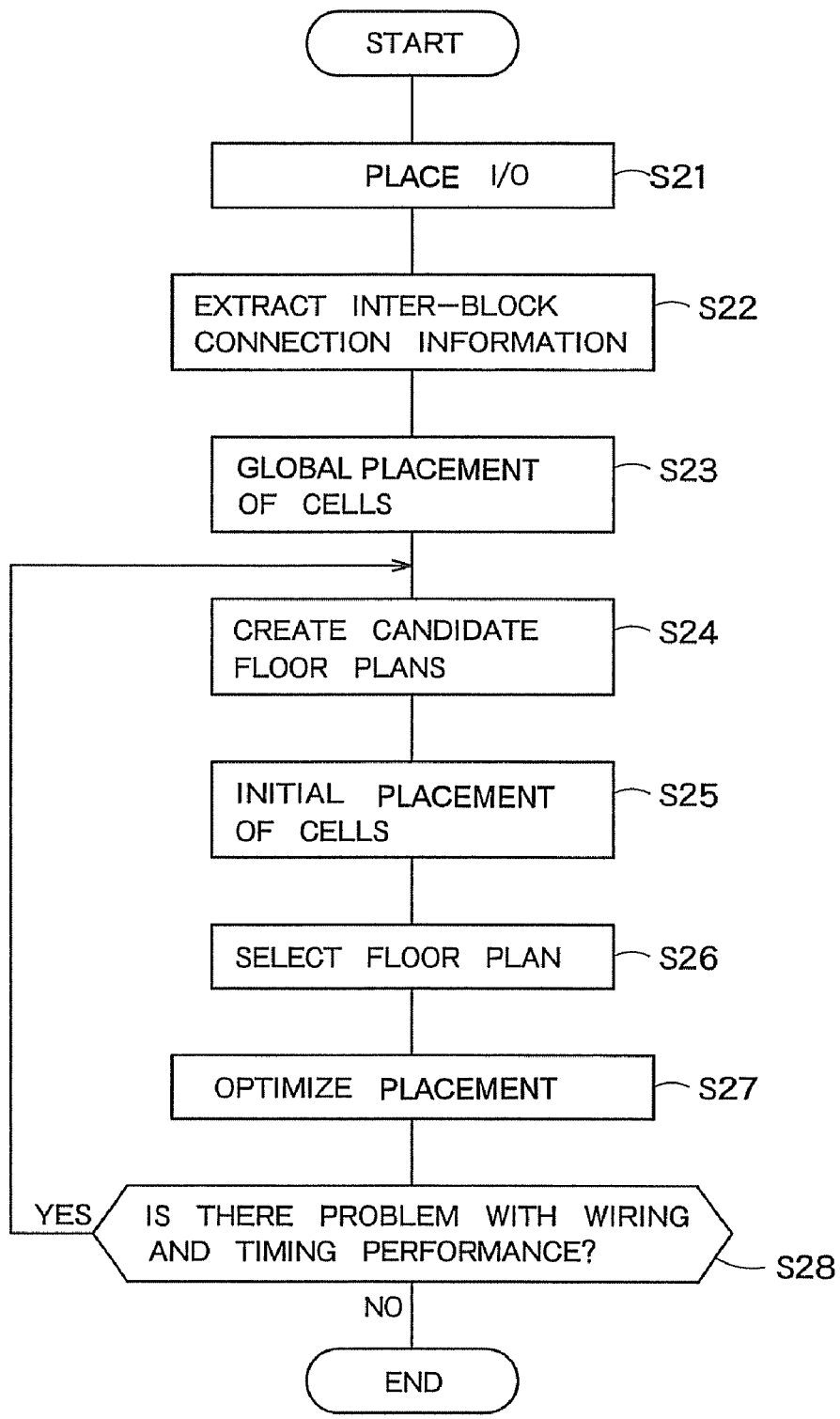
F I G. 7

SEMICONDUCTOR LAYOUT DESIGN APPARATUS AND METHOD FOR EVALUATING A FLOORPLAN USING DISTANCES BETWEEN STANDARD CELLS AND MACROCELLS

CROSS REFERENCE TO RELATED APPLICATIONS

This application is based upon and claims the benefit of priority from the prior Japanese Patent Application No. 2006-311985, filed on Nov. 17, 2006, the entire contents of which are incorporated herein by reference.

BACKGROUND OF THE INVENTION

1. Field of the Invention

The present invention relates to a semiconductor layout design apparatus, a semiconductor layout design method and a computer readable medium that performs layout design of a semiconductor circuit using standard cells and macrocells.

2. Related Art

To place standard cells and macrocells on a semiconductor substrate is called a floor plan. Floor plan for each individual semiconductor circuit is not limited to one. Multiple floor plans can be designed on which standard cells and macrocells are placed in different ways.

Therefore, it is a common practice to perform evaluation for comparison and verification of their qualities after they are created.

Standard cells and macrocells logically related with one another contained in a floor plan are integrated into one block. Methods for evaluating such a block as a unit are known.

In Japanese Patent Laid-Open No. 06-244280, the wiring lengths are calculated from predicted areas and positions of blocks placed. In Japanese Patent Laid-Open No. 2006-190062, a predicted delay value on inter-block net is calculated and the maximum wiring length that meets the predicted delay value on each inter-block net is determined from the predicted delay value and a delay characteristic of inter-block net rules.

However, the accuracies of wiring lengths calculated by the approaches in Japanese Patent Laid-Open No. 06-244280 and No. 2006-190062 are low because a global placement of blocks differs from an actual block placement that is determined after cells are placed by an automatic place and route (P & R) tool.

It may be contemplated to place a restriction on a cell placement by an automatic P & R tool so that an actual block placement matches a global block placement by the tool. However, optimization of cell placements is prevented, and good results are not obtained by using the tool.

Methods for evaluating placements after final optimization use the results of wiring congestion analysis and timing analysis that are based on rough wiring and such methods are implemented in commercially available automatic P & R tools. These methods can evaluate the performances of floor plans with high accuracy. However, it takes long time before completion of final optimization of an placement.

The conventional methods cannot accurately evaluate floor plans before completion of optimization of placements and layouts must be designed without fully narrowing down candidate floor plans for a long time, resulting in an increased number of man-hours and high costs for design.

SUMMARY OF THE INVENTION

According to one aspect of the present invention, a semiconductor layout design apparatus comprising:

an inter-block connection information extracting part configured to extract the number of wiring connections between a plurality of blocks including standard cells and macrocells based on a net list, library information, floor plan information and technology information;

a cell initial placement part configured to initially place the standard cells and the macrocells in an placement region to generate an initial floor plan; and an evaluation value calculating part configured to calculate an evaluation value of the floor plan based on distances between a plurality of blocks including the standard cells and the macrocells initially placed by the cell initial placement part and the extracted number of the wiring connections between a plurality of blocks.

According to one aspect of the present invention, a semiconductor layout design method comprising:

extracting the number of wiring connections between a plurality of blocks including standard cells and macrocells based on a net list, library information, floor plan information and technology information;

initially placing the standard cells and the macrocells in an placement region to generate an initial floor plan; and calculating an evaluation value of the floor plan based on distances between a plurality of blocks including the initially placed standard cells and the macrocells and the extracted number of the wiring connections between a plurality of blocks.

According to one aspect of the present invention, a computer readable medium storing a computer program code, the computer program code making a computer executing:

extracting the number of wiring connections between a plurality of blocks including standard cells and macrocells based on a net list, library information, floor plan information and technology information;

initially placing the standard cells and the macrocells in an placement region to generate an initial floor plan; and calculating an evaluation value of the floor plan based on distances between a plurality of blocks including the initially placed standard cells and the macrocells and the extracted number of the wiring connections between a plurality of blocks.

BRIEF DESCRIPTION OF THE DRAWINGS

FIG. 1 is a block diagram schematically showing a configuration of a semiconductor layout design apparatus according to a first embodiment of the present invention;

FIG. 4 is a flowchart showing a processing procedure performed by a floor plan evaluation value calculating part 15 according to a second embodiment;

FIG. 5A is a diagram showing an example in which an placement region 51 is divided into 4×4=16 grid squares;

FIG. 5B is an enlarged view of a grid square 52 represented as a shaded portion in FIG. 5A;

FIG. 7 is a flowchart of a processing procedure performed by a semiconductor layout design apparatus according to a third embodiment.

DETAILED DESCRIPTION OF THE INVENTION

Figure 2:
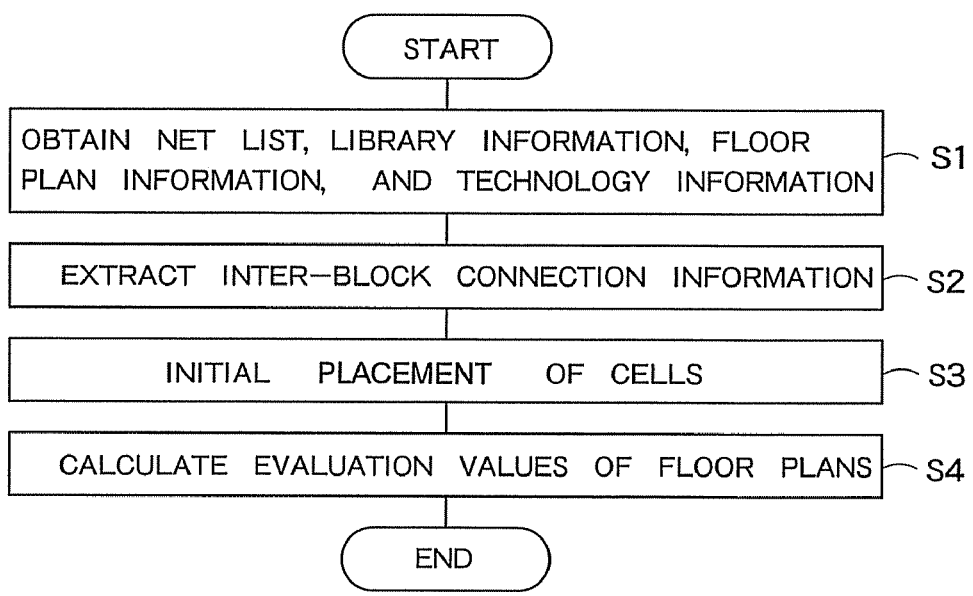
FIG. 2 is a flowchart of a processing procedure performed by the semiconductor layout design apparatus shown in FIG. 1.

Embodiments of the present invention will be described with reference to the accompanying drawings.

FIRST EMBODIMENT

First Embodiment

FIG. 1 is a block diagram schematically showing a configuration of a semiconductor layout design apparatus according to a first embodiment of the present invention. The semiconductor layout design apparatus shown in FIG. 1 includes a processor 1, a display device 2, a net list memory device 3, a library information memory device 4, a floor plan information memory device 5, a technology information memory device 6, and a floor plan evaluation result memory device 7. The processor 1 and memory devices are interconnected through a network line 8. The processor 1 sends and receives various kinds of data to and from the memory devices through the network line 8. The memory devices may be connected onto an internal bus or external bus of the processor 1 instead of the network line 8.

The processor 1 includes an interface part 11, an inter-block connection information extracting part 12, a cell initial placement part 13, a candidate floor plan generating part 14, a floor plan evaluation value calculating part 15, a floor plan selecting part 16, an placement optimizing part 17, and a verifying part 18.

The interface part 11 performs processing for retrieving a net list stored in the net list memory device 3, library information stored in the library information memory device 4, floor plan information stored in the floor plan information memory device 5, and technology information stored in the technology information memory device 6, and processing for sending evaluation result of a floor plan to the floor plan evaluation result memory device 7.

A net list is data describing connection information of semiconductor circuits formed on a semiconductor substrate. Library information is circuit information of circuit components such as standard cells, macrocells and gates that can be placed in an placement region. Floor plan information indicates what kind of standard cells and macrocells are placed on each floor plan. Technology information is information such as a width of wiring placed in an placement region and signal propagation delay times.

The inter-block connection information extracting part 12 extracts the number of wiring connections between blocks. The term "block" as used herein refers to a region containing multiple standard cells and macrocells logically related to one another. Multiple blocks are placed in an placement region.

The cell initial placement part 13 performs an initial placement of standard cells and macrocells based on a net list, library information and floor plan information input through the interface part 11. The candidate floor plan generating part 14 generates multiple candidate floor plans based on a net list, library information, floor plan information and technology information.

The floor plan evaluation value calculating part 15 calculates an evaluation value for each individual candidate floor plan. The method for calculating evaluation values will be detailed later. The calculated evaluation values are stored in the floor plan evaluation result memory device 7.

The floor plan selecting part 16 selects the candidate floor plan whose evaluation value is the smallest. The placement optimizing part 17 finely adjusts placements of standard cells and macrocells in the floor plan selected by the floor plan selecting part 16. It performs optimization processing such as adjustment of cell driving performance/improvement of the number of gates and insertion of buffer cells in order to improve timing.

The verifying part 18 verifies wiring logics and timing of a floor plan that has been finely adjusted by the placement optimizing part 17.

It should be noted that the candidate floor plan generating part 14, the floor plan selecting part 16, the placement optimizing part 17, and the verifying part 18 in FIG. 1 are not essential for the embodiment and therefore can be omitted.

FIG. 2 is a flowchart showing a processing procedure performed by the semiconductor layout design apparatus in FIG. 1. First, the interface part 11 obtains a net list, library information, floor plan information and technology information (step S1). Then, the inter-block connection information extracting part 12 extracts the number of wiring connections between blocks containing standard cells and macrocells (step S2).

The cell initial placement part 13 performs an initial placement of standard cells and macrocells based on the net list, library information, and floor plan information obtained at step S1 (cell initial placement) (step S3).

Then, the floor plan evaluation value calculating part 15 extracts block placement information including one or more pieces of representative-coordinate information calculated from the result of the cell initial placement and calculates an evaluation value of the floor plan based on the extracted placement information and the number of wiring connections between blocks extracted at step S2 (step S4).

Any of multiple approaches may be used for extracting representative coordinate information of a block. For example, the center point of a block may be used as the representative point and the coordinates of the center point may be calculated. Based on the result of the cell initial placement at step S3, the coordinates of each cell placed in the block are calculated. Here, the coordinates of the leftmost end of a block are denoted by "$x_{min}$", the coordinates of the rightmost end are denoted by "$x_{max}$"; the coordinates of the lowermost end are denoted by "$y_{min}$", and the coordinate of the uppermost end are denoted by "$y_{max}$". Then, the center point coordinates C(x, y) of the block can be expressed by $$C(x,y)=((x_{min}+x_{max})/2,(y_{min}+y_{max})/2) \qquad (1)$$

Alternatively, the average position of the center points of the cells placed in a block may be calculated as the representative point. The number "n" of the cells in a block and the coordinates $(x_i, y_i)$ of each cell in the block are detected from the result of the cell initial placement performed at step S3. Then, the average position A(x, y) of the center points of the cells in the block can be represented by $$A(x,y)=(\Sigma x_i/n, \Sigma y_i/n) \qquad (2).$$

Alternatively, the barycenter of a block may be calculated as the representative point. If the number "n" of the cells in a block and the coordinates $(x_i, y_i)$ of each cell in the block are detected from the result of the cell initial placement at step S3 and the area of each cell is denoted by "ai", then the barycentric coordinates G(x, y) of the block can be expressed by $$G(x,y)=(\Sigma(x_i*a_i)/\Sigma a_i, \Sigma(y_i*a_i)/\Sigma a_i) \quad (3).$$

If the areas of the cells in a block significantly differ from one another and density of the blocks is fluctuated in initial placement of the cells, it is effective to calculate the barycenter of the block as the representative point as described above.

The floor plan evaluation value calculating part 15 calculates the distance between blocks based on the coordinates of the representative points calculated by using any of the approaches described above.

Figure 3:
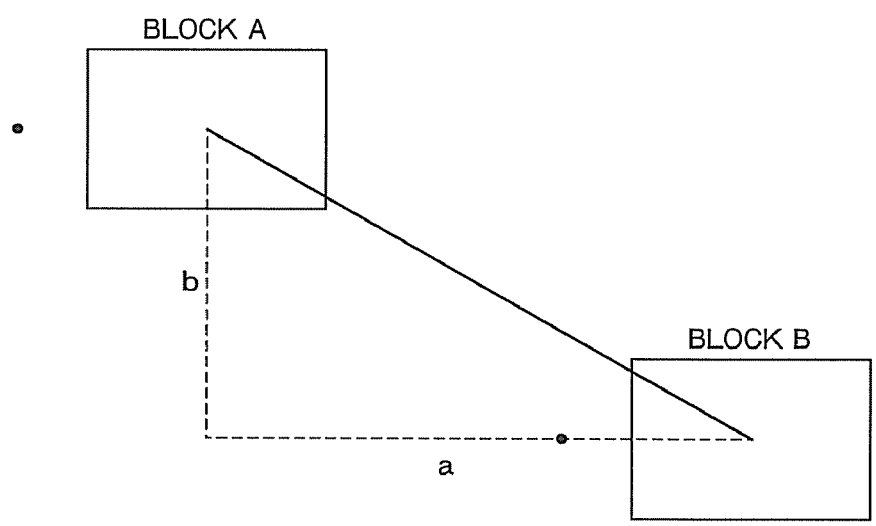
FIG. 3 is a diagram illustrating an approach for calculating the distance between blocks.

FIG. 3 is a diagram illustrating an approach for calculating the distance between blocks. In FIG. 3, the distance between blocks "A" and "B" may be calculated as the shortest distance in a straight line between a representative point of block "A" and a representative point of block "B" or as the Manhattan distance between a representative point of block "A" and a representative point of block "B", which will be described later.

The floor plan evaluation value calculating part 15 uses the distance between blocks calculated by any of the approaches described above and the number of wiring connections between the blocks to calculate an evaluation value "F" of the floor plan according to the following equation $$F=\Sigma D_{ij}*C_{ij} \quad (4)$$

where "$D_{ij}$" is the distance between blocks "i" and "j"; and "$C_{ij}$" is the number of wiring connections between the blocks. As can be seen from Equation (4), the longer the distance between blocks or the greater the number of wiring connections between the blocks, the greater is the evaluation value "F". Therefore the smaller the evaluation value "F", the higher is the performance of the floor plan.

The evaluation values of floor plans calculated with the procedure described above are stored in the floor plan evaluation result memory device 7 shown in FIG. 1. The evaluation values of floor plans are used for selecting candidate floor plans, which will be described with respect to an embodiment described later.

As has been described above, according to the first embodiment, the distance between blocks is calculated based on the result of an initial placement of standard cells and macrocells and an evaluation value of the floor plan is calculated based on the distance and the number of wiring connections between the blocks. Accordingly, accuracy of the evaluation value of the floor plan is higher than the case where the evaluation value were calculated before the initial placement of cells. Thus, the performance of the floor plan can be more accurately evaluated.

Second Embodiment

In a second embodiment, the distance between blocks used for calculating the evaluation value of a floor plan is calculated more precisely than in the first embodiment. In particular, the second embodiment differs from the first embodiment in the processing and operation of the floor plan evaluation value calculating part 15. The following description will focus on the difference from the first embodiment.

FIG. 4 is a flowchart of a processing procedure performed by the floor plan evaluation value calculating part 15 according to the second embodiment. First, the coordinates of representative points of blocks are calculated with the same procedure as in the first embodiment (step S11) and the densities of cells placed in the blocks are statistically analyzed (step S12).

In the processing at step S12, first the block is divided into a grid of squares and the density of the cells in each grid square is calculated.

FIG. 5A shows an example in which an placement region 51 is divided into 4×4=16 grid squares and FIG. 5B is an enlarged view of a grid square 52 indicated as a shaded portion in FIG. 5A.

Five standard cells 501 to 505 are placed in the grid square 52 in FIG. 5B. Actually, a portion of another standard cell 506 is placed in the grid square 52. However, the standard cell 506 is not considered to be located in the grid square 52 because the barycentric position (or central position) of the standard cell 506 is located outside the grid square 52.

The areas of the five standard cells in the grid square 52 are denoted by "$S_{cell\_501}$", "$S_{cell\_502}$", "$S_{cell\_503}$", "$S_{cell\_504}$", and "$S_{cell\_505}$" and the area of the grid square 52 is denoted by "$S_{grid\_52}$". Then, the cell placement density "$\rho_{grid\_i}$" can be expressed by $$\rho_{grid\_i}=(S_{cell\_501}+S_{cell\_502}+S_{cell\_503}+S_{cell\_504}+S_{cell\_505})/S_{grid\_52} \quad (5)$$

Figure 6A:
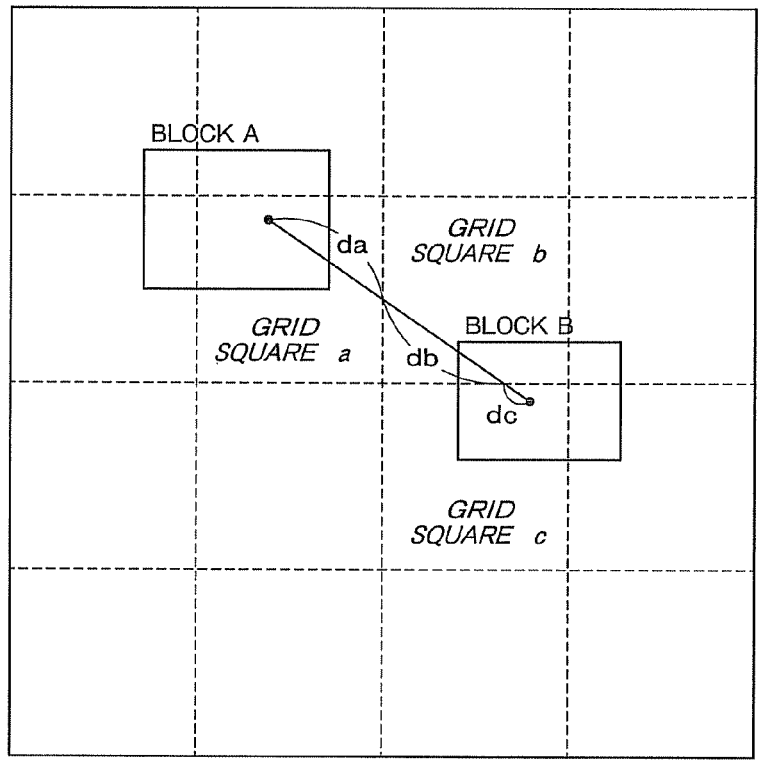
FIG. 6A is a diagram showing an example in which the distance from the center of block "A" to the center of block "B" is calculated.

After the completion of the processing at steps S11 and S12 showed in FIG. 4, the distance between blocks is calculated (step S13). FIG. 6 is a diagram illustrating the processing at step S13. FIG. 6A shows an example in which the placement region is divided into 4×4=16 grid squares and the distance in a straight line between the center of block "A" and the center of block "B" is calculated. The straight line passes through grid squares "a, "b", and "c". If the length of line segment of the straight line in grid square "a" is denoted by "$d_a$", in grid square "b" by "$d_b$" and in grid square "c" by "$d_c$" and the densities in grid square "a", "b", and "c" are denoted by "$\rho_{grid\_a}$", "$\rho_{grid\_b}$", and "$\rho_{grid\_c}$", respectively, then distance "$D_{AB}$" between blocks "A" and "B" can be expressed by $$D_{AB}=\rho_{grid\_a}*d_a+\rho_{grid\_b}*d_b+\rho_{grid\_c}*d_c \quad (6).$$

Equation (6) can be generalized as $$D_{ij}=\Sigma \rho_{grid\_k}*d_k \quad (7).$$

In Equation (7), "$\rho_{grid\_k}$" is the cell placement density of each grid square through which the straight line between the representative points of two blocks passes, "$d_k$" is the length of the straight line segment in each grid square, and k=1 to n, where "n" is the number of grid squares through which the straight line between the representative points of the two blocks passes.

The distance between blocks calculated at step S13 may be calculated as the Manhattan distance between the blocks instead of the distance in a straight line between the centers of the blocks.

Figure 6B:
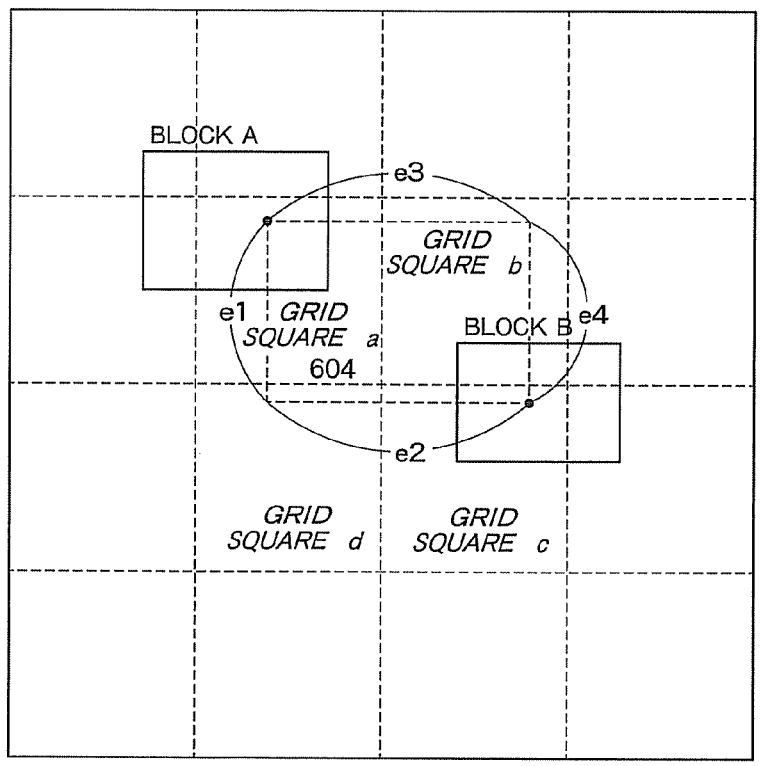
FIG. 6B is a diagram illustrating a method for calculating the Manhattan distance between blocks "A" and "B"

FIG. 6B is a diagram illustrating a method for calculating the Manhattan distance between blocks "A" and "B". The Manhattan distance between blocks "A" and "B" in FIG. 6B is the sum of the distances of two sides of a rectangular region having the representative points of blocks "A" and "B" as its diagonal edges. In this case, the distance can be the sum of sides "e1" and "e2" or the sum of sides "e3" and "e4".

Since side "e1" passes through grid squares "a" and "d", distance "$D_{e1}$" of side "e1" can be expressed by $$D_{e1}=\rho_{grid\_a}*e1a+\rho_{grid\_d}*e1d \quad (8)$$

where "$\rho_{grid\_a}$" and "$\rho_{grid\_d}$" are the densities in grid squares "a" and "b", respectively, "e1a" is the length of the segment of side "e1" in grid square "a" and "e1d" is the length of the segment of side "e1" in grid square "d".

Since side "e2" passes through grid squares "d" and "c", distance "$D_{e2}$" of side "e2" can be expressed by $$D_{e2} = \rho_{grid\_d} * e2d + \rho_{grid\_c} * e2c \tag{9}$$

where "$\rho_{grid\_d}$" and "$\rho_{grid\_c}$" are the densities in grid squares "d" and "c", "e2d" is the length of the segment of side "e2" in grid square "d", and "e2c" is the length of the segment of side "e2" in grid square "c".

The distances of sides "e3" and "e4" are calculated similarly. The sum of the distances of sides "e1" and "e2" or the sum of the distances of side "e3" and "e4", whichever is greater, is selected as the Manhattan distance between blocks "A" and "B".

In this way, the distance between blocks may be calculated as the distance in a straight line between the blocks or the Manhattan distance between the blocks.

Step S11 of FIG. 4 described above is equivalent to representative point extracting part, step S12 is equivalent to placement density detecting part, and step S13 is equivalent to distance calculating part.

After calculating the distance between blocks at step S13 of FIG. 4, the floor plan evaluation value calculating part 15 calculates an evaluation value of the floor plan in accordance with Equation (4) described above (step S14).

As has been described above, according to the second embodiment, the distance between blocks is calculated by taking into consideration the densities of cells placed in blocks. If the density of cells in a block is high, the distance is increased. Thus, the evaluation value can be corrected so that the cell densities are reflected in the evaluation value. Accordingly, evaluation values that correspond with real cell placements can be calculated and the accuracy of the evaluation of floor plans can be improved.

Third Embodiment

In a third embodiment, the evaluation values of floor plans calculated in the first or second embodiment are used to select an optimum floor plan for designing a semiconductor circuit.

FIG. 7 is a flowchart of a processing procedure performed by a semiconductor layout design apparatus according to the third embodiment. First, I/O elements are placed in an placement region (step S21). The processing at step S21 is performed by the processor 1 shown in FIG. 1 in a conventional manner. The inter-block connection information extracting part 12 extracts information about connections between blocks (more specifically, the number of wiring connections) (step S22). Then, the processor 1 executes an automatic P & R tool to roughly place standard cells and macrocells in the placement region (step S23). The purpose of the global placement is to determine the relative positions of blocks that result in short wiring lengths. The macrocells are not fixed in the automatic placement so that the P & R tool can optimize the relative positions of the blocks.

The processor 1 creates candidate floor plans based on the relative positions of the blocks roughly placed at step S23 (step S24). Then, the cell initial placement part 13 performs an initial placement of standard cells and macrocells on each of the created candidate floor plans (step S25).

Then, the floor plan evaluation value calculating part 15 calculates evaluation values of the floor plans by using the approach of the first or second embodiment. The processor 1 selects the floor plan whose evaluation value is the smallest (step S26).

The placement optimizing part 17 performs optimization processing for the cell initial placement on the floor plan selected at step S26, such as adjustment of cell positions and cell driving performance, improvement of the number of gates, and insertion of buffer cells, and performs timing improvement processing (step S27).

The verifying part 18 verifies the wiring and timing performance of the floor plan optimized at step S27 (step S28).

If no problem is found as a result of the verification at step S28, the floor plan is determined as the final floor plan. The placement optimization processing at step 27 is time consuming processing. By evaluating floor plans prior to the processing at step S27 as in the third embodiment, the need for performing the placement optimization processing a number of times can be eliminated and the time required for design can be reduced.

On the other hand, if a problem with wiring and timing performance is found as a result of the verification at step S28, the process returns to step S24 and creation of candidate floor plans is performed again.

According to the third embodiment, floor plans are evaluated to select an optimum floor plan in an early stage, in particular before optimization processing for an placement, as has been described above. Thus, it is unnecessary to perform the optimization processing for placement a number of times, and therefore the number of man-hours and costs required for design can be reduced.

The processor 1 shown in FIG. 1 may be implemented by a single computer or multiple computers. The parts 11 to 18 contained in the processor 1 may be implemented by hardware or software. If any of the parts are implemented by software, a computer may be caused to read and execute a program that performs processing and operation of the parts 11 to 18.

What is claimed is:

1. A semiconductor layout design apparatus comprising:
    an inter-block connection information extracting part configured to extract the number of wiring connections between a plurality of blocks including standard cells and macrocells based on a net list, library information, floor plan information and technology information;
    a cell initial placement part configured to initially place the standard cells and the macrocells in an placement region to generate an initial floor plan;
    a distance calculating part configured to calculate distances between the plurality of blocks based on coordinates of the standard cells and macrocells included in the initial floor plan; and
    an evaluation value calculating part configured to calculate an evaluation value of the floor plan based on the calculated distances and the extracted number of the wiring connections between a plurality of blocks.

2. The semiconductor layout design apparatus according to claim 1 further comprising:
    a candidate floor plan generating part configured to generate a plurality of candidate floor plans based on the net list, the library information, the floor plan information and the technology information,
    wherein the cell initial placement part initially places the standard cells and the macrocells in the placement region by each of the plurality of candidate floor plans; and
    the evaluation value calculating part calculates the evaluation value corresponding to each of the plurality of candidate floor plans based on the distance between the plurality of blocks including the standard cells and the macrocells placed by the cell initial placement part and the wiring connections between the plurality of blocks extracted by the inter-block connection information extracting part.

3. The semiconductor layout design apparatus according to claim 2 further comprising:
a floor plan selecting part configured to select a candidate floor plan having a minimum evaluation value calculated by the evaluation value calculating part;
an placement optimizing part configured to perform an optimizing processing for placement of the standard cells and the macrocells in the placement region by using the candidate floor plan selected by the floor plan selecting part; and
a verifying part configured to verify wiring and timing performance with respect to the floor plan after the optimizing processing is performed.

4. The semiconductor layout design apparatus according to claim 1,
wherein the evaluation value calculation part includes:
a representative point extracting part configured to extract representative points of the plurality of blocks;
an placement density detecting part configured to detect placement densities of the standard cells and the macrocells in each of the plurality of blocks; and a distance calculating part configured to calculate the distance between the blocks used for calculation of the evaluation value based on the representative points extracted by the representative point extracting part and the placement densities detected by the placement density detecting part.

5. The semiconductor layout design apparatus according to claim 4,
wherein the placement density detecting part detects the placement densities of the standard cells and the macrocells with respect to each of a plurality of grids obtained by dividing each of the plurality of blocks into a plurality of pieces.

6. The semiconductor layout design apparatus according to claim 4,
wherein the distance calculating part includes:
a grid setting part configured to divide the placement region into a plurality of grids to set a density to each of the grids; and
a distance weighing part configured to calculate a value obtained by weighing a distance in each grid with the density of each grid by each grid located between the blocks, and to set a value obtained by adding each weighed value as the distance between the blocks used for the calculation of the evaluation value.

7. The semiconductor layout design apparatus according to claim 4,
wherein the distance calculating part calculates a minimum distance between the blocks as the distance between the blocks used for the calculation of the evaluation value.

8. The semiconductor layout design apparatus according to claim 4,
wherein the distance calculating part calculates a sum of the distances of two sides of a rectangular region having the representative points of the blocks as diagonal edges thereof, the sum being set the distance between the blocks used for the calculation of the evaluation value.

9. The semiconductor layout design apparatus according to claim 4,
wherein the evaluation value calculating part sets a value obtained by multiplying the distances between the blocks by the number of the wiring connections between the blocks as the evaluation value.

10. A semiconductor layout design method comprising:
extracting by an inter-block connection information extracting part, the number of wiring connections between a plurality of blocks including standard cells and macrocells based on a net list, library information, floor plan information and technology information;
initially placing by a cell initial placement part, the standard cells and the macrocells in an placement region to generate an initial floor plan;
calculating by a distance calculating part, distances between the plurality of blocks based on coordinates of the standard cells and macrocells included in the initial floor plan; and
calculating by an evaluation value calculating part, an evaluation value of the floor plan based on the calculated distances and the extracted number of the wiring connections between a plurality of blocks.

11. The method according to claim 10 further comprising:
generating a plurality of candidate floor plans based on the net list, the library information, the floor plan information and the technology information,
wherein the initially placing places the standard cells and the macrocells in the placement region by each of the plurality of candidate floor plans; and
the calculating of the evaluation value calculates the evaluation value corresponding to each of the plurality of candidate floor plans based on the distance between the plurality of blocks including the initially placed standard cells and the macrocells and the extracted wiring connections between the plurality of blocks.

12. The method according to claim 11 further comprising:
selecting a candidate floor plan having a minimum evaluation value among the calculated evaluation values;
performing an optimizing processing for placement of the standard cells and the macrocells in the placement region by using the selected candidate floor plan; and
verifying wiring and timing performance with respect to the floor plan after the optimizing processing is performed.

13. The method according to claim 10,
wherein the calculating of the evaluation value includes:
extracting representative points of the plurality of blocks;
detecting placement densities of the standard cells and the macrocells in each of the plurality of blocks; and
calculating the distance between the blocks used for calculation of the evaluation value based on the extracted representative points and the detected placement densities.

14. The method according to claim 13,
wherein the detecting of the placement densities detects the placement densities of the standard cells and the macrocells with respect to each of a plurality of grids obtained by dividing each of the plurality of blocks into a plurality of pieces.

15. The method according to claim 13,
wherein the calculating of the distance includes:
dividing the placement region into a plurality of grids to set a density to each of the grids; and
calculating a value obtained by weighing a distance in each grid with the density of each grid by each grid located between the blocks, and setting a value obtained by adding each weighed value as the distance between the blocks used for the calculation of the evaluation value.

16. The method according to claim 13,
wherein the calculating of the distance calculates a minimum distance between the blocks as the distance between the blocks used for the calculation of the evaluation value.

17. The method according to claim 13,
wherein the calculating of the distance calculates a sum of the distances of two sides of a rectangular region having the representative points of the blocks as diagonal edges thereof, the sum being set the distance between the blocks used for the calculation of the evaluation value.

18. The method according to claim 10,
wherein the calculating of the distance sets a value obtained by multiplying the distances between the blocks by the number of the wiring connections between the blocks as the evaluation value.

19. A computer readable medium storing a computer program code, the computer program code causing a computer to perform the following acts:
extracting the number of wiring connections between a plurality of blocks including standard cells and macrocells based on a net list, library information, floor plan information and technology information;
initially placing the standard cells and the macrocells in an placement region to generate an initial floor plan;
calculating by a distance calculating part, distances between the plurality of blocks based on coordinates of the standard cells and macrocells included in the initial floor plan; and
calculating an evaluation value of the floor plan based on the calculated distances and the extracted number of the wiring connections between a plurality of blocks.

20. The medium according to claim 19 further executing:
generating a plurality of candidate floor plans based on the net list, the library information, the floor plan information and the technology information,
wherein the initially placing places the standard cells and the macrocells in the placement region by each of the plurality of candidate floor plans; and
the calculating of the evaluation value calculates the evaluation value corresponding to each of the plurality of candidate floor plans based on the distance between the plurality of blocks including the initially placed standard cells and the macrocells and the extracted wiring connections between the plurality of blocks.

* * * * *